US011282998B2

(12) United States Patent
Lee et al.

(10) Patent No.: US 11,282,998 B2
(45) Date of Patent: Mar. 22, 2022

(54) FLEXIBLE THERMOELECTRIC MODULE CELL FOR TOUCH SENSOR, TOUCH SENSOR INCLUDING THE SAME, AND METHOD OF MANUFACTURING THE FLEXIBLE THERMOELECTRIC MODULE CELL FOR TOUCH SENSOR

(71) Applicant: KOOKMIN UNIVERSITY INDUSTRY ACADEMY COOPERATION FOUNDATION, Seoul (KR)

(72) Inventors: Hyun Jung Lee, Seoul (KR); Jong Chan Baek, Uijeongbu-si (KR); Hyun Woo Bark, Seoul (KR); Jung Hun Oh, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 0 days.

(21) Appl. No.: 16/832,296

(22) Filed: Mar. 27, 2020

(65) Prior Publication Data
US 2020/0313061 A1   Oct. 1, 2020

(30) Foreign Application Priority Data

Mar. 29, 2019 (KR) .................. 10-2019-0037320

(51) Int. Cl.
*H01L 35/32* (2006.01)
*H01L 35/24* (2006.01)
(Continued)

(52) U.S. Cl.
CPC .............. *H01L 35/32* (2013.01); *H01L 35/06* (2013.01); *H01L 35/24* (2013.01); *H01L 35/34* (2013.01);
(Continued)

(58) Field of Classification Search
CPC ......... H01L 35/32; H01L 35/24; H01L 35/34; H01L 35/06; G06F 3/041; G06F 2203/04102; G06F 2203/04103
See application file for complete search history.

(56) References Cited

U.S. PATENT DOCUMENTS

| 2006/0118158 A1* | 6/2006 | Zhang | H01L 35/34 |
| | | | 136/205 |
| 2011/0154558 A1* | 6/2011 | Peter | H01L 35/34 |
| | | | 2/243.1 |
| 2016/0251992 A1* | 9/2016 | Kim | H01L 35/34 |
| | | | 136/205 |

FOREIGN PATENT DOCUMENTS

| JP | 2008010358 A | | 1/2008 |
| JP | 2013023547 A | * | 2/2013 |

(Continued)

OTHER PUBLICATIONS

KR1020170128955 Machine Translation, Lee (Year: 2017).*
JP2013023547, Machine Translation, Ishihara (Year: 2013).*

*Primary Examiner* — Devina Pillay
(74) *Attorney, Agent, or Firm* — Sughrue Mion, PLLC

(57) ABSTRACT

Disclosed herein are a flexible thermoelectric module cell for a touch sensor, a touch sensor including the same, and a method of manufacturing the flexible thermoelectric module cell for a touch sensor. The flexible thermoelectric module cell is applicable to cells for touch sensors of various designs, without the need for a person to go directly to an industrially dangerous place.

17 Claims, 7 Drawing Sheets

(51) Int. Cl.
*H01L 35/34* (2006.01)
*H01L 35/06* (2006.01)
*G06F 3/041* (2006.01)

(52) U.S. Cl.
CPC .... *G06F 3/041* (2013.01); *G06F 2203/04102* (2013.01)

(56) References Cited

FOREIGN PATENT DOCUMENTS

| | | | | |
|---|---|---|---|---|
| KR | 20020056882 A | 7/2002 | | |
| KR | 1020170128955 | * 11/2017 | ............. | B29C 64/00 |

* cited by examiner

FLEXIBLE THERMOELECTRIC MODULE CELL FOR TOUCH SENSOR, TOUCH SENSOR INCLUDING THE SAME, AND METHOD OF MANUFACTURING THE FLEXIBLE THERMOELECTRIC MODULE CELL FOR TOUCH SENSOR

CROSS-REFERENCE TO RELATED APPLICATION

This application claims the benefit of Korean Patent Application No. 10-2019-0037320, filed on Mar. 29, 2019, in the Korean Intellectual Property Office, the disclosure of which is incorporated herein in its entirety by reference.

BACKGROUND

1. Field

One or more embodiments relate to a flexible thermoelectric module cell for a touch sensor, a touch sensor including the same, and a method of manufacturing the flexible thermoelectric module cell for a touch sensor.

2. Description of Related Art

With the development of various information displays, the demand for using portable information media increases, and accordingly, interest in and research on display devices are increasing. Generally, these display devices include a touch sensor configured to receive a touch input by a user along with an image display function. A touch sensor refers to a sensor through which it is possible for an instruction displayed on a screen to be input when the screen is pressed by a fingertip.

Such touch sensors can be classified into pressure-sensitive, capacitive, and infrared touch sensors according to their operating principle. Among these, a capacitive touch sensor is most widely used. However, capacitive touch sensors are expensive and can be touched only by a body part or object having conductivity, and the sensors are sensitive such that malfunctions can frequently be caused by an external environment that may affect weak pressure or conductivity.

To address these problems, there is a need for a touch sensor having a novel operating principle, and further, for a flexible thermoelectric module cell for a touch sensor applicable to various designs and a method of manufacturing the flexible thermoelectric module cell for a touch sensor.

SUMMARY

One or more embodiments include a flexible thermoelectric module cell for a touch sensor which not only has flexible mechanical properties such as combined ductility and rigidity, but the voltage and power of which is also controllable by adjusting the number of block p-type thermoelectric element pieces and block n-type thermoelectric element pieces.

One or more embodiments include a touch sensor including the flexible thermoelectric module cell.

One or more embodiments include a method of manufacturing the flexible thermoelectric module cell for a touch sensor.

Additional aspects will be set forth in part in the description which follows and, in part, will be apparent from the description, or may be learned by practice of the presented embodiments of the disclosure.

According to one or more embodiments, a flexible thermoelectric module cell for a touch sensor includes:

a main body including a polymer including a main chain of a siloxane-based structural unit, and at least one vinyl group-containing photopolymerizable acrylate-based compound and an isocyanate-based compound that are linked to the main chain; and block p-type thermoelectric elements and block n-type thermoelectric elements that are alternately inserted into the main body.

The siloxane-based structural unit may be a structural unit derived from a siloxane-based monomer having a hydroxyl group at an end thereof.

The vinyl group-containing photopolymerizable acrylate-based compound may include a compound selected from 2-hydroxyethyl methacrylate, 3,3,5-trimethyl cyclohexyl acrylate, and a combination thereof.

The isocyanate-based compound may include isophorone diisocyanate.

The polymer may include a polymer represented by Formula 1 below:

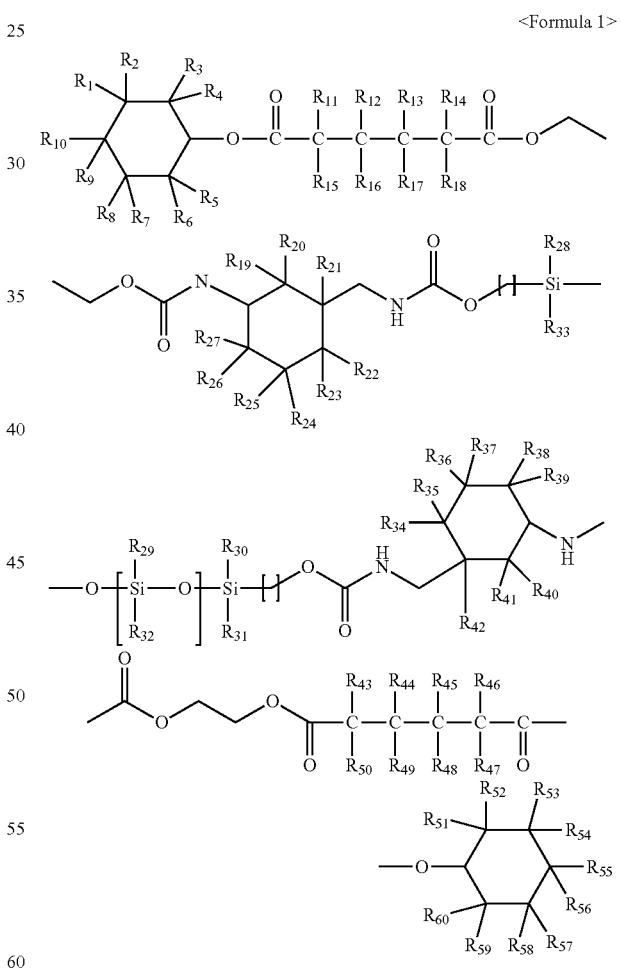

<Formula 1> wherein, in Formula 1, $R_1$ to $R_{60}$ are each independently a hydrogen atom, a deuterium atom, a substituted or unsubstituted $C_1$-$C_{10}$ alkyl group, or a combination thereof.

The polymer may have a weight average molecular weight of 1,000 or more.

The block p-type thermoelectric elements or the block n-type thermoelectric elements may each independently include nanoparticles, nanowires, nanobelts, nanoribbons, or a combination thereof consisting of at least one element selected from a transition metal, a rare earth element, a Group 13 element, a Group 14 element, a Group 15 element, and a Group 16 element.

The block p-type thermoelectric elements and the block n-type thermoelectric elements may be connected in series via metal electrodes.

The block p-type thermoelectric elements or the block n-type thermoelectric elements may be each independently replaceable.

Power may be controllable by adjusting the number of the block p-type thermoelectric elements and the block n-type thermoelectric elements.

The flexible thermoelectric module cell may be operable by a voltage change generated according to a difference in external temperature through the Seebeck effect.

The flexible thermoelectric module cell may have a maximum stress of 18 MPa.

The flexible thermoelectric module cell may have a maximum strain of 120%.

According to one or more embodiments, a touch sensor includes the above-described flexible thermoelectric module cell.

The touch sensor may include a plurality of buttons, wherein each of the plurality of buttons includes the flexible thermoelectric module cell.

According to one or more embodiments, a method of manufacturing a flexible thermoelectric module cell for a touch sensor includes:

photopolymerizing a composition for forming a main body polymer, the composition including a monomer having a siloxane-based structural unit with a hydroxyl group at an end thereof, at least one vinyl group-containing photopolymerizable acrylate-based compound, and an isocyanate-based compound, to thereby synthesize a main body;

packing a mold with p-type thermoelectric element powder or n-type thermoelectric element powder and sintering and cutting the packed mold to prepare block p-type thermoelectric elements and block n-type thermoelectric elements; and alternately inserting the block p-type thermoelectric elements and the block n-type thermoelectric elements into the main body and arranging a metal paste and metal wires to manufacture the above-described flexible thermoelectric module cell.

The vinyl group-containing photopolymerizable acrylate-based compound may include 3,3,5-trimethyl cyclohexyl acrylate in an amount of about 0.01 wt % to about 50 wt % with respect to a total of 100 wt % of the composition for forming a main body polymer.

The method may further include connecting the block p-type thermoelectric elements and the block n-type thermoelectric elements in series via metal wires.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
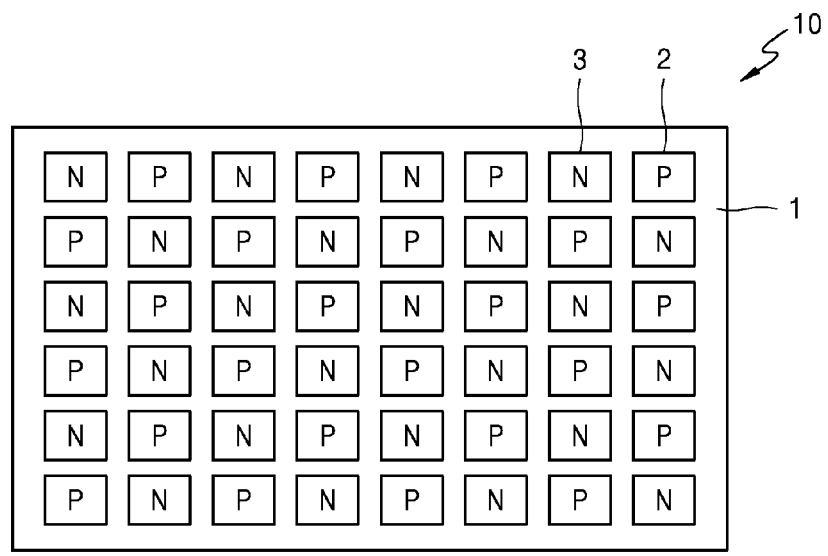
FIG. 1 is a view illustrating a flexible thermoelectric module cell 10 for a touch sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, a flexible thermoelectric module cell for a touch sensor according to an example embodiment, a touch sensor including the same, and a method of manufacturing the flexible thermoelectric module cell for a touch sensor will be described in detail with reference to the accompanying drawings. The embodiments set forth herein are provided for illustrative purposes only and are not intended to limit the present disclosure, and the present disclosure should be defined only by the scope of the appended claims. In addition, in the present specification and drawings, constituent elements having substantially the same function and configuration are denoted by like reference numeral, and thus redundant description is omitted.

Although methods and materials that are similar or equivalent to those described in the present specification may be used in implementations or experiments of the present disclosure, suitable methods and materials are described in the present specification.

In the present specification, "-based structural unit (or compound)" is a broad concept encompassing "-based structural unit (or compound)" and/or "derivatives of a -based structural unit (or compound)."

In a capacitive touch sensor, which is generally and widely used, an error may occur at a touch recognition position for various reasons, such as a case in which a screen is touched by a fingertip with water or hands that are sweaty, a case in which a display device including a capacitive touch sensor is not grounded during charging, thus causing a short circuit to occur in a metal body of the display device, or when touching under an electric lamp such as a fluorescent lamp.

To address these problems, the inventors of the present disclosure have proposed a flexible thermoelectric module cell for a touch sensor, which will be described below.

FIG. 1 is a view illustrating a flexible thermoelectric module cell 10 for a touch sensor according to an embodiment.

Referring to FIG. 1, the flexible thermoelectric module cell 10 for a touch sensor according to an embodiment may include a main body 1, and block p-type thermoelectric elements 2 and block n-type thermoelectric elements 3 that are alternately inserted into the main body 1.

The main body 1 may include a polymer including a main chain of a siloxane-based structural unit, and at least one vinyl group-containing photopolymerizable acrylate-based compound and an isocyanate-based compound that are linked to the main chain. The main body 1 may secure sufficient mechanical properties such as stress and strain.

Since the block p-type thermoelectric elements 2 and block n-type thermoelectric elements 3 are alternately inserted into the main body 1, thermoelectric elements that are not in operation are independently replaceable, and power may be easily controlled.

Figure 2:
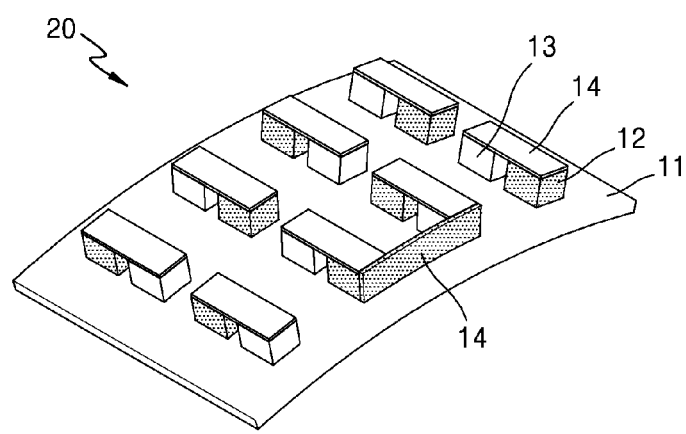
FIG. 2 is a perspective view illustrating a flexible thermoelectric module cell 20 for a touch sensor according to an embodiment.

FIG. 2 is a perspective view illustrating a flexible thermoelectric module cell 20 for a touch sensor according to an embodiment.

Referring to FIG. 2, the flexible thermoelectric module cell 20 for a touch sensor according to an embodiment includes a main body 11, which is flexible due to a combination of ductility and rigidity, and thus is applicable to touch sensors having various designs. It is illustrated that the flexible thermoelectric module cell 20 for a touch sensor includes block p-type thermoelectric elements 12 and block n-type thermoelectric elements 13 that are alternately inserted into the main body 11, and the block p-type thermoelectric elements 12 and the block n-type thermoelectric elements 13 are connected via metal electrodes 14.

The siloxane-based structural unit may be a structural unit derived from a siloxane-based monomer having a hydroxyl group at an end thereof. The hydroxyl group may be one or more hydroxyl groups.

The vinyl group-containing photopolymerizable acrylate-based compound may include a compound selected from 2-hydroxyethyl methacrylate, 3,3,5-trimethyl cyclohexyl acrylate, and a combination thereof. The rigidity and ductility of the vinyl group-containing photopolymerizable acrylate-based compound may be adjusted so that the compound has mechanical properties suitable for application to touch sensors having various designs. In addition, as necessary, a polymer in which a chain monomer and/or a cyclic monomer is further linked to the vinyl group-containing photopolymerizable acrylate-based compound may also be used.

The isocyanate-based compound may include isophorone diisocyanate. The isocyanate-based compound may impart flexibility to the main body 1.

The polymer may include a polymer represented by Formula 1 below:

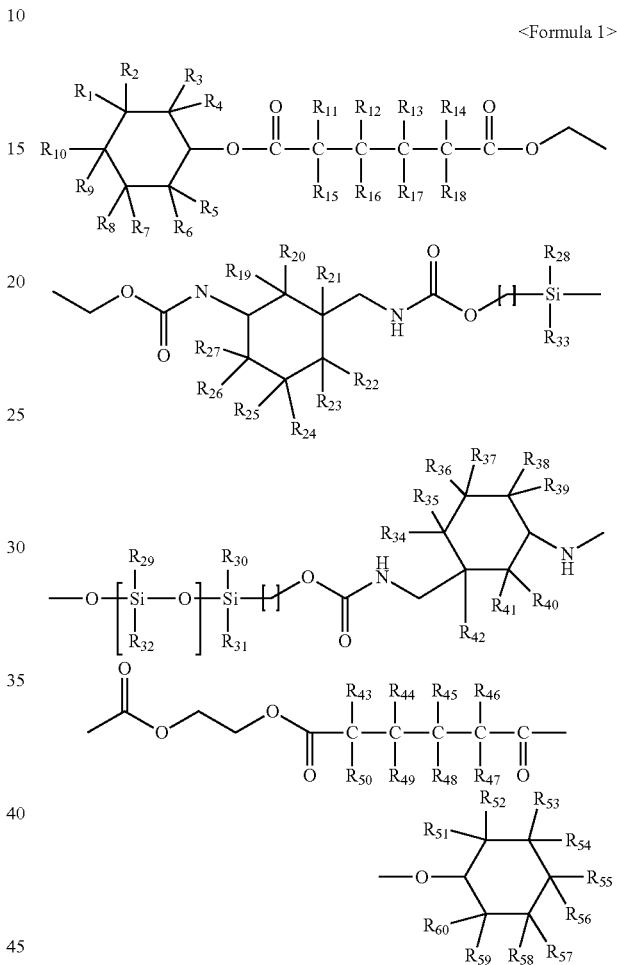

<Formula 1> wherein, in Formula 1, $R_1$ to $R_{60}$ may be each independently a hydrogen atom, a deuterium atom, a substituted or unsubstituted $C_1$-$C_{10}$ alkyl group, or a combination thereof. For example, the $R_1$ to $R_{60}$ may be each independently a hydrogen atom, a substituted or unsubstituted $C_1$-$C_5$ alkyl group, or a combination thereof. For example, the $R_1$ to $R_{60}$ may be each independently a hydrogen atom, a substituted or unsubstituted $C_1$-$C_3$ alkyl group, or a combination thereof. For example, the $R_1$ to $R_{60}$ may be each independently a hydrogen atom, a substituted or unsubstituted $C_1$ alkyl group, or a combination thereof.

The term "substituted" in the substituted alkyl group used in Formula 1 above refers to being substituted with a halogen atom, a $C_1$-$C_5$ alkyl group substituted with a halogen atom (e.g., $CCF_3$, $CHCF_2$, $CH_2F$, or $CCl_3$), a hydroxyl group, a nitro group, a cyano group, an amino group, an amidino group, hydrazine, hydrazone, a carboxylic acid or a salt thereof, a sulfonic acid group or a salt thereof, a phosphoric acid group or a salt thereof, a $C_1$-$C_5$ alkyl group, or a $C_2$-$C_5$ alkenyl group.

Non-limiting examples of "alkyl group" used in Formula 1 above may include methyl, ethyl, propyl, isobutyl, sec-butyl, ter-butyl, neo-butyl, iso-amyl, and hexyl.

"Alkenyl group" described above with respect to the term "substituted" is a group in which one hydrogen atom is removed from an alkylene group such as ethylene, propylene, isobutylene, sec-butylene, ter-butylene, neo-butylene, or iso-amylene, and may be, for example, a vinyl group or the like.

The polymer may have a weight average molecular weight of 1,000 or more. The weight average molecular weight of the polymer may be measured according to a method widely known in the art. For example, the weight average molecular weight may be measured by gel permeation chromatography (GPC).

The block p-type thermoelectric elements or the block n-type thermoelectric elements may each independently include nanoparticles, nanowires, nanobelts, nanoribbons, or a combination thereof, which consist of at least one element selected from a transition metal, a rare earth element, a Group 13 element, a Group 14 element, a Group 15 element, and a Group 16 element.

For example, the transition metal may include at least one element selected from titanium (Ti), zirconium (Zr), hafnium (Hf), vanadium (V), niobium (Nb), tantalum (Ta), chromium (Cr), molybdenum (Mo), tungsten (W), manganese (Mn), iron (Fe), cobalt (Co), nickel (Ni), copper (Cu), zinc (Zn), silver (Ag), and rhenium (Re), the rare earth element may include at least one element selected from yttrium (Y), cerium (Ce), and lanthanum (La), the Group 13 element may include at least one element selected from boron (B), aluminum (Al), gallium (Ga), and indium (In), the Group 14 element may include at least one element selected from carbon (C), silicon (Si), germanium (Ge), tin (Sn), and lead (Pb), the Group 15 element may include at least one element selected from phosphorus (P), arsenic (As), antimony (Sb), and bismuth (Bi), and the Group 16 element may include at least one element selected from sulfur (S), selenium (Se), and tellurium (Te).

For example, the block p-type thermoelectric elements or the block n-type thermoelectric elements may be each independently at least one selected from tellurium nanoparticles, tellurium nanowires, tellurium nanobelts, tellurium nanoribbons, bismuth nanoparticles, bismuth nanowires, bismuth nanobelts, bismuth nanoribbons, selenium nanoparticles, selenium nanowires, selenium nanobelts, selenium nanoribbons, antimony nanoparticles, antimony nanowires, antimony nanobelts, antimony nanoribbons, and a combination thereof. For example, the block p-type thermoelectric elements or the block n-type thermoelectric elements may be each independently at least one selected from tellurium nanoparticles, bismuth nanoparticles, $Bi_2Te_3$ nanoparticles, and $Sb_2Te_3$ nanoparticles. The shape of the nanoparticles is not limited, but may be, for example, a powder form. The block p-type thermoelectric elements or the block n-type thermoelectric elements may sufficiently secure electrical conductivity.

Figure 3:
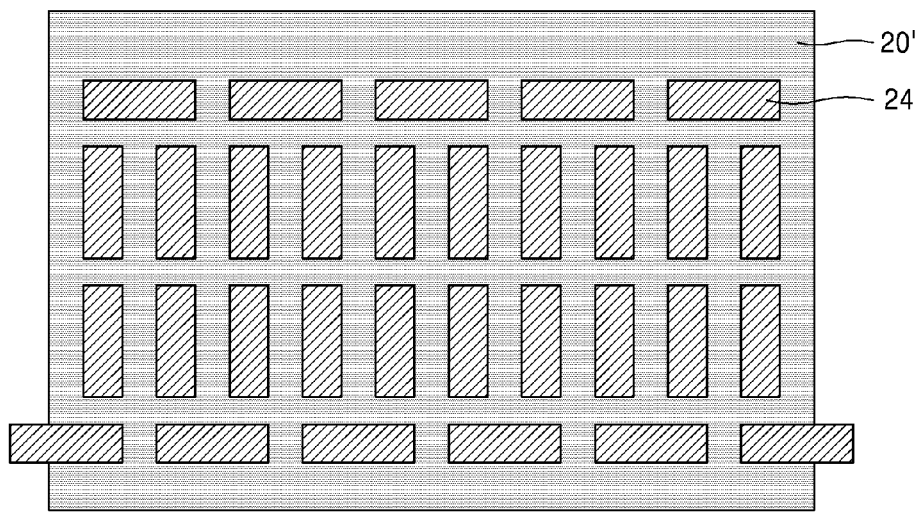
FIG. 3 is a schematic top view of a frame 20' having a plurality of block openings, and in which block p-type thermoelectric elements and block n-type thermoelectric elements are connected in series via metal electrodes.
Figure 4:
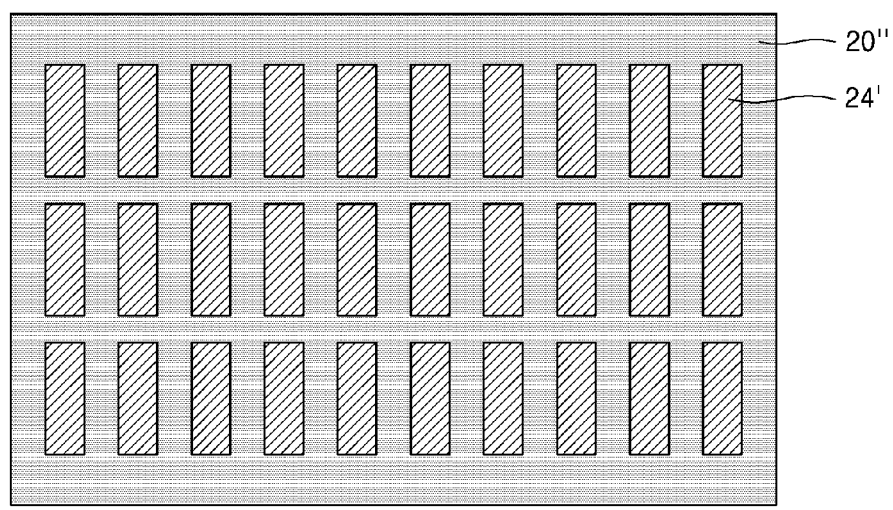
FIG. 4 is a schematic bottom view of a frame 20" having a plurality of block openings, and in which block p-type thermoelectric elements and block n-type thermoelectric elements are connected in series via metal electrodes.

FIG. 3 is a schematic top view of a frame 20' having a plurality of block openings, and in which block p-type thermoelectric elements and block n-type thermoelectric elements are connected in series via metal electrodes. FIG. 4 is a schematic bottom view of a frame 20" having a plurality of block openings, and in which block p-type thermoelectric elements and block n-type thermoelectric elements are connected in series via metal electrodes.

Referring to FIGS. 3 and 4, the block p-type thermoelectric elements and the block n-type thermoelectric elements may be integrally formed in the frame 20' or 20" having block openings, i.e., a main body. Due to such a configuration, the flexible thermoelectric module cell according to an embodiment has a very stable structure, and the voltage and power of the cell may be sufficiently controlled.

The block p-type thermoelectric elements and the block n-type thermoelectric elements may be each independently replaced.

The number of the block p-type thermoelectric elements and the block n-type thermoelectric elements may be adjusted, thus enabling power control.

The metal electrode may include, for example, copper, silver, gold, platinum, lithium, titanium, aluminum, nickel, or the like. The metal electrode may be formed by applying or patterning a metal paste on a base. The patterning process may be performed using, for example, a lift-off semiconductor process, a deposition method, a photolithography method, or the like. As necessary, the metal electrode may also include a carbon material-based composite electrode.

The flexible thermoelectric module cell may be operated by a voltage change generated in accordance with a difference in external temperature through the Seebeck effect. Such a type of flexible thermoelectric module cell enables touch sensing only based on the thermoelectric effect, and thus may be applied to cells for touch sensors with various designs without a need for a person to go directly to an industrially dangerous place.

The flexible thermoelectric module cell may have a maximum stress of 18 MPa.

The flexible thermoelectric module cell may have a maximum strain of 120%.

A touch sensor according to another embodiment may include the above-described flexible thermoelectric module cell.

The touch sensor includes a plurality of buttons, and each of the plurality of buttons may include the flexible thermoelectric module cell.

Figure 5:
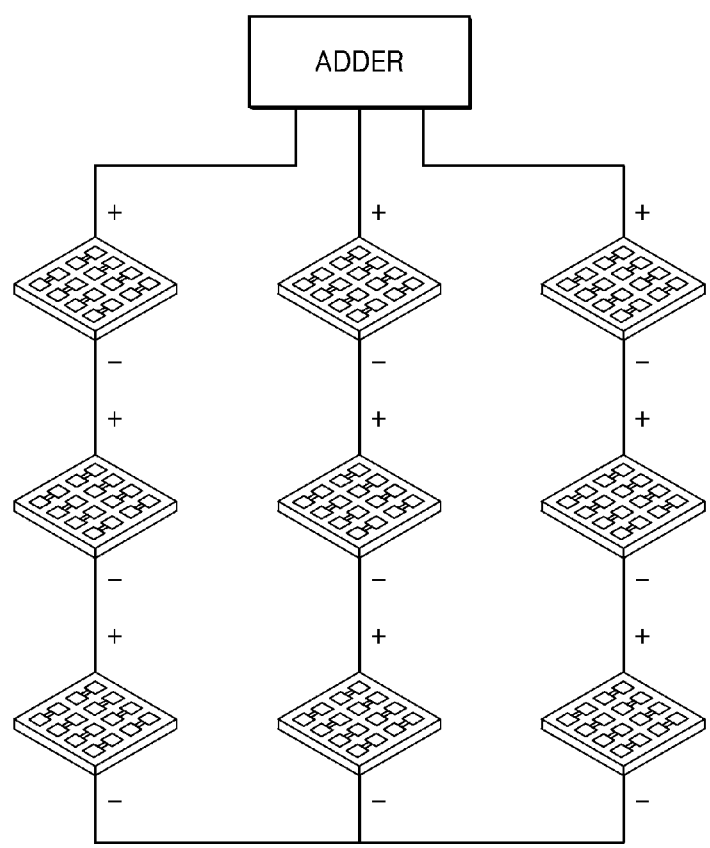
FIG. 5 is a view of a touch sensor according to an embodiment.

FIG. 5 is a view of a touch sensor according to an embodiment.

Referring to FIG. 5, in the touch sensor according to an embodiment, the flexible thermoelectric module cell includes a plurality of buttons, and the plurality of buttons are connected via electrical wires of positive (+) and negative (−) polarity, respectively. The touch sensor is configured such that, when some buttons from among the plurality of buttons are pressed, an electrical signal is transmitted in the (+) direction. The flexible thermoelectric module cells may be arranged in series, and cells not in series may each have independent outputs.

The touch sensor according to an embodiment includes a flexible thermoelectric module cell that not only has flexible mechanical properties such as combined ductility and rigidity, but also has voltage and power which are controllable by adjusting the number of block p-type thermoelectric element pieces and block n-type thermoelectric element pieces, but the shape of the touch sensor is not limited to the above example, and it is possible to use any type of touch sensor that may be used in the art.

A method of manufacturing a flexible thermoelectric module cell for a touch sensor, according to another embodiment, may include: photopolymerizing a composition for forming a main body polymer, the composition including a monomer having a siloxane-based structural unit with a hydroxyl group at an end thereof, at least one vinyl group-containing photopolymerizable acrylate-based compound, and an isocyanate-based compound, to thereby synthesize a main body; packing a mold with p-type thermoelectric element powder or n-type thermoelectric element powder and sintering and cutting the packed mold to prepare block p-type thermoelectric elements and block n-type thermoelectric elements; and alternately inserting the block p-type thermoelectric elements and the block n-type thermoelectric elements into the main body and arranging a metal paste and metal wires to manufacture the above-described flexible thermoelectric module cell for a touch sensor.

The method of manufacturing a flexible thermoelectric module cell for a touch sensor according to an embodiment may enable easy manufacture of a flexible thermoelectric module cell capable of exhibiting a touch sensing effect only through the thermoelectric effect.

First, a composition for forming a main body polymer, including a siloxane-based monomer having a hydroxyl group at an end thereof, at least one vinyl group-containing photopolymerizable acrylate-based compound, and an isocyanate-based compound, is photopolymerized to synthesize a main body.

The types of the structural unit of the siloxane-based monomer, the vinyl group-containing photopolymerizable acrylate-based compound, and the isocyanate-based compound are the same as described above, and thus detailed descriptions thereof will be omitted herein.

The vinyl group-containing photopolymerizable acrylate-based compound may include 3,3,5-trimethyl cyclohexyl acrylate in an amount of about 0.01 wt % to about 50 wt % with respect to a total of 100 wt % of the composition for forming a main body polymer. When the amount of the 3,3,5-trimethyl cyclohexyl acrylate is within the above range, the 3,3,5-trimethyl cyclohexyl acrylate may sufficiently complement mechanical properties of the main body, i.e., stress, strain, and the like, without exhibiting the properties thereof itself.

Next, p-type thermoelectric element powder or n-type thermoelectric element powder is packed into a mold, followed by sintering and cutting, to thereby prepare block p-type thermoelectric elements and block n-type thermoelectric elements.

The material of the mold is not particularly limited, but the mold may be, for example, a graphite mold. The sintering method may be, for example, a spark plasma sintering method or the like. The spark plasma sintering method may be performed at a temperature of 450° C. and a pressure of 48 MPa in a vacuum for 4 minutes when bismuth telluride is used as an n-type thermoelectric element, and may be performed at a temperature of 500° C. and a pressure of 48 MPa in a vacuum for 6 minutes when antimony telluride is used as a p-type thermoelectric element, but the present invention is not necessarily limited to these conditions, and the conditions may be appropriately changed within a range that can improve the performance coefficient of the thermoelectric element. The sizes of the p-type thermoelectric element and the n-type thermoelectric element may be predetermined sizes in consideration of the voltage and powder of a main body to be applied.

Next, the block p-type thermoelectric elements and the block n-type thermoelectric elements are alternately inserted into the main body, and a metal paste and metal wires are arranged, to manufacture the above-described flexible thermoelectric module cell.

The method of manufacturing a flexible thermoelectric module cell for a touch sensor may further include connecting the block p-type thermoelectric elements and the block n-type thermoelectric elements in series via metal wires. The metal paste and the metal wires are the same as describe above with respect to the type and formation method of the metal electrodes.

Hereinafter, examples and comparative examples of the present disclosure will be described. However, these examples are provided for illustrative purposes only and are not intended to limit the present disclosure.

EXAMPLES

Synthesis Example 1: Synthesis of Main Body Polymer

Isophorone diisocyanate (IPDI, extra pure, manufactured by DAEJUNG CHEMICALS & METALS CO., LTD.) was placed in a three-neck round-bottom flask and subjected to nitrogen purging at 40° C. for 20 minutes.

Subsequently, 200 g of polydimethyl siloxane (PDMS, manufactured by Shanghai Gileader Advanced Material Technology) containing a hydroxyl group at an end thereof and 0.02 wt % of dibutyltin dilaurate as a catalyst (manufactured by Junsei Chemical) with respect to a total of 100 wt % of a composition for forming a first polymer were added into the flask at 40° C., followed by stirring for 2 hours, thereby obtaining a first polymer (see FIG. 6(1)) in which IPDI is linked to a PDMS main chain having a siloxane structural unit and containing a hydroxyl group.

Subsequently, 13 g of 2-hydroxyethyl methacrylate (2-HEMA, 97%, manufactured by Sigma-Aldrich) and 0.02 wt % of dibutyltin dilaurate as a catalyst (manufactured by Junsei Chemical) with respect to a total of 100 wt % of a composition for forming a second polymer were added to the first polymer at 40° C., followed by stirring for 2 hours, thereby obtaining a second polymer (see FIG. 6(2)) in which 2-HEMA is linked to the main chain of the first polymer.

Figure 6:
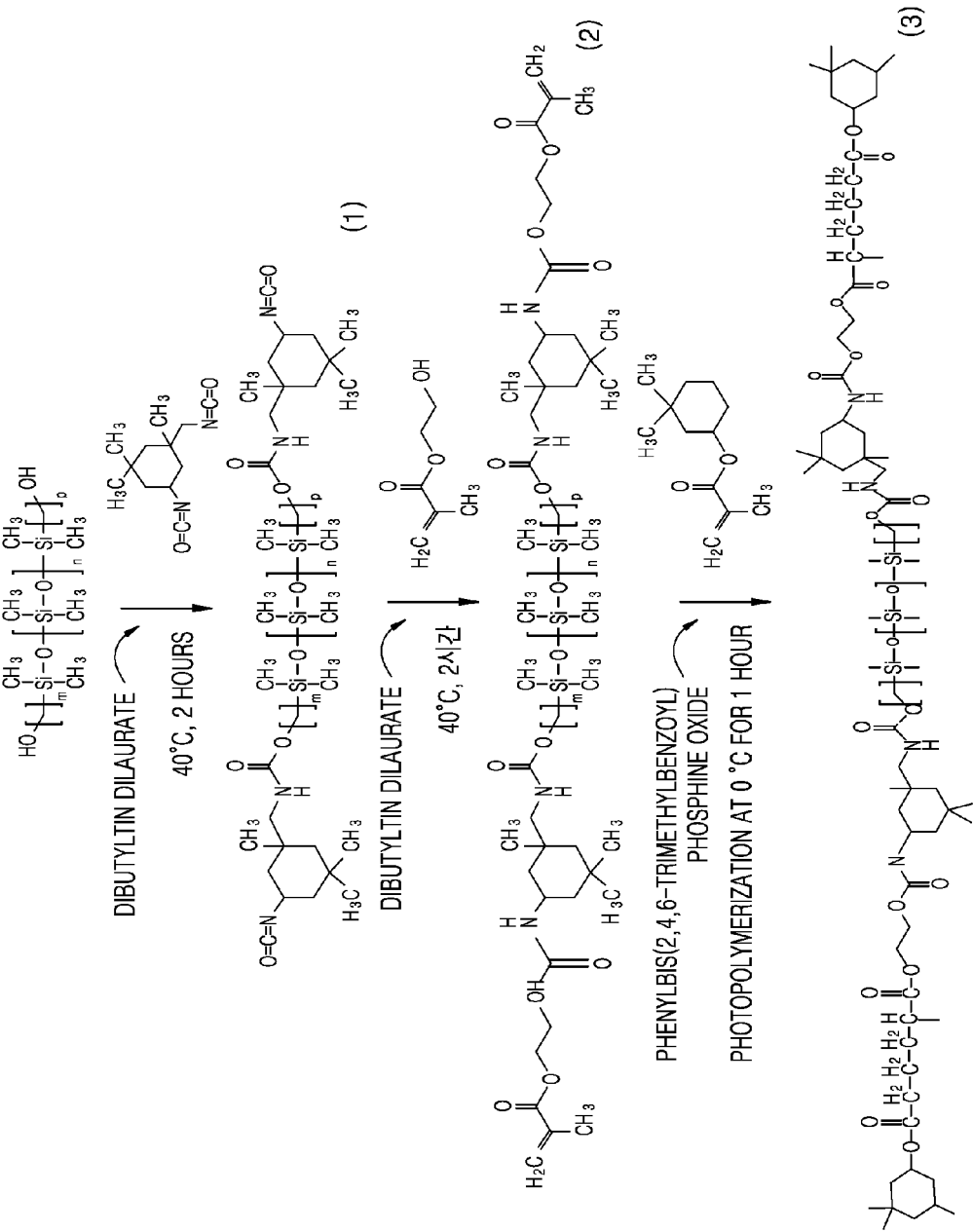
FIG. 6 illustrates a reaction scheme illustrating a method of synthesizing a main body polymer according to Synthesis Example 1.
Figure 7:
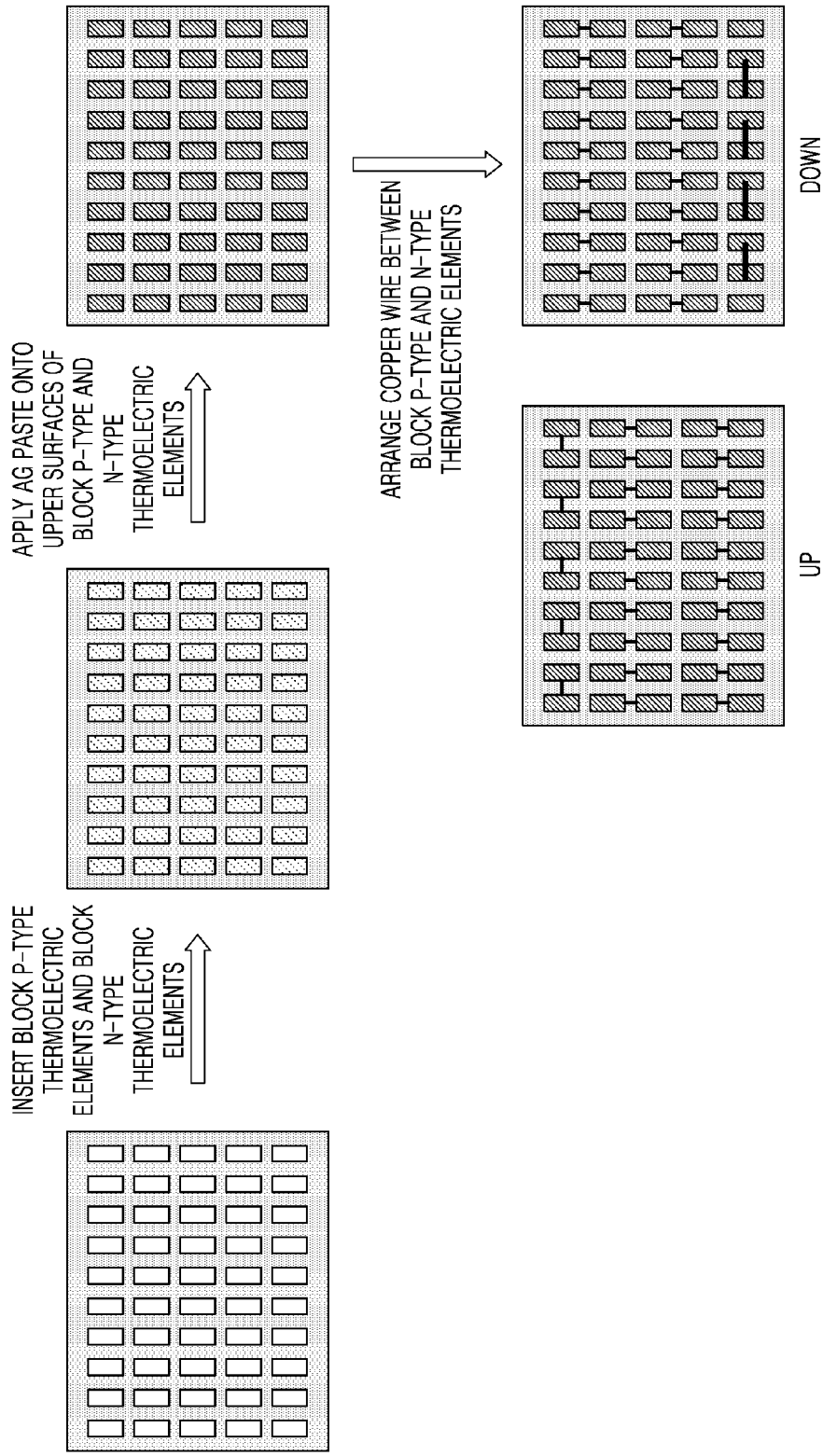
FIG. 7 is a flowchart illustrating a method of manufacturing a flexible thermoelectric module cell for a touch sensor, according to an embodiment.

10 wt % of 3,3,5-trimethyl cyclohexyl acrylate (SR420, manufactured by Sartomer Americas) with respect to a total of 100 wt % of a composition for forming a main body polymer and phenylbis(2,4,6-trimethylbenzoyl)phosphine oxide (Irgacure819, manufactured by BASF) as a photoinitiator were added to the second polymer, stirred at 0° C. for 1 hour, and then subjected to a photopolymerization reaction by transmitting light at a frequency of about 50/60 Hz for 5 minutes, thereby completing the synthesis of a main body polymer (see FIG. 6(3)) in which 3,3,5-trimethyl cyclohexyl acrylate is linked to the main chain of the second polymer. A reaction scheme for the synthesis of the main body polymer is illustrated in FIG. 6.

Synthesis Example 2: Synthesis of Main Body Polymer

A main body polymer (see FIG. 6(3)) in which 3,3,5-trimethyl cyclohexyl acrylate is linked to the main chain of the second polymer was synthesized in the same manner as in Synthesis Example 1, except that the 3,3,5-trimethyl cyclohexyl acrylate (SR420, manufactured by Sartomer Americas) was added to the second polymer in an amount of 30 wt %, instead of 10 wt %, with respect to a total of 100 wt % of the composition for forming a main body polymer.

Synthesis Example 3: Synthesis of Main Body Polymer

A main body polymer (see FIG. 6(3)) in which 3,3,5-trimethyl cyclohexyl acrylate is linked to the main chain of the second polymer was synthesized in the same manner as in Synthesis Example 1, except that the 3,3,5-trimethyl cyclohexyl acrylate (SR420, manufactured by Sartomer Americas) was added to the second polymer in an amount of 50 wt %, instead of 10 wt %, with respect to a total of 100 wt % of the composition for forming a main body polymer.

Comparative Synthesis Example 1: Synthesis of Main Body Polymer

A main body polymer (see FIG. 6(3)) in which 3,3,5-trimethyl cyclohexyl acrylate is linked to the main chain of the second polymer was synthesized in the same manner as in Synthesis Example 1, except that the 3,3,5-trimethyl cyclohexyl acrylate (SR420, manufactured by Sartomer Americas) was added to the second polymer in an amount of 60 wt %, instead of 10 wt %, with respect to a total of 100 wt % of the composition for forming a main body polymer.

Example 1: Manufacture of Flexible Thermoelectric Module Cell for Touch Sensor

A coin-type graphite mold having a diameter of 2 cm was prepared. The mold was packed with each of 6.5 g of $Sb_2Te_3$ powder (antimony(III) telluride, −325 mesh size, manufactured by Sigma Aldrich) as a p-type thermoelectric element and 7.2 g of $Bi_2Se_3$ powder (bismuth(III) telluride, −325 mesh size, manufactured by Sigma Aldrich) as an n-type thermoelectric element, followed by spark plasma sintering (SPS) at a pressure of 48 MPa and a heating rate of 15° C./min in a temperature range of 450° C. to 500° C. for about 4-6 hours, thereby obtaining a coin-type p-type $Sb_2Te_3$ thermoelectric element and coin-type n-type $Bi_2Se_3$ thermoelectric element having a diameter of 2 cm and a height of 0.3 cm.

Each of the coin-type p-type $Sb_2Te_3$ thermoelectric element and the coin-type n-type $Bi_2Se_3$ thermoelectric element was cut into a size of 0.25 cm (length)×0.15 cm (width), thereby obtaining 30 block p-type $Sb_2Te_3$ thermoelectric element pieces and 30 block n-type $Bi_2Se_3$ thermoelectric element pieces.

The obtained block p-type $Sb_2Te_3$ thermoelectric element pieces and block n-type $Bi_2Se_3$ thermoelectric element pieces were inserted into a mold that was output by a 3D printer using a photocurable resin according to Synthesis Example 3 and had a plurality of block openings. Thereafter, the obtained block p-type $Sb_2Te_3$ thermoelectric element pieces and block n-type $Bi_2Se_3$ thermoelectric element pieces were connected in series using a silver paste and copper wires, thereby completing the manufacture of a flexible thermoelectric module cell for a touch sensor, having a height of 0.3 cm.

Example 2: Manufacture of Flexible Thermoelectric Module Cell for Touch Sensor

A flexible thermoelectric module cell for a touch sensor was manufactured in the same manner as in Example 1, except that 24 block p-type $Sb_2Te_3$ thermoelectric element pieces and 24 block n-type $Bi_2Se_3$ thermoelectric element pieces were used instead of the 30 block p-type $Sb_2Te_3$ thermoelectric element pieces and 30 block n-type $Bi_2Se_3$ thermoelectric element pieces.

Example 3: Manufacture of Flexible Thermoelectric Module Cell for Touch Sensor

A flexible thermoelectric module cell for a touch sensor was manufactured in the same manner as in Example 1, except that 18 block p-type $Sb_2Te_3$ thermoelectric element pieces and 18 block n-type $Bi_2Se_3$ thermoelectric element pieces were used instead of the 30 block p-type $Sb_2Te_3$ thermoelectric element pieces and 30 block n-type $Bi_2Se_3$ thermoelectric element pieces.

Example 4: Manufacture of Flexible Thermoelectric Module Cell for Touch Sensor

A flexible thermoelectric module cell for a touch sensor was manufactured in the same manner as in Example 1, except that 12 block p-type $Sb_2Te_3$ thermoelectric element pieces and 12 block n-type $Bi_2Se_3$ thermoelectric element pieces were used instead of the 30 block p-type $Sb_2Te_3$ thermoelectric element pieces and 30 block n-type $Bi_2Se_3$ thermoelectric element pieces.

Example 5: Manufacture of Flexible Thermoelectric Module Cell for Touch Sensor

A flexible thermoelectric module cell for a touch sensor was manufactured in the same manner as in Example 1, except that 6 block p-type $Sb_2Te_3$ thermoelectric element pieces and 6 block n-type $Bi_2Se_3$ thermoelectric element pieces were used instead of the 30 block p-type $Sb_2Te_3$ thermoelectric element pieces and 30 block n-type $Bi_2Se_3$ thermoelectric element pieces.

Evaluation Example 1: Evaluation of Mechanical Properties

The mechanical properties of the main body polymers synthesized according to Synthesis Examples 1 to 3 and Comparative Synthesis Examples 1 and 2 were evaluated using a multi-purpose tensile tester (Intron 5567). The results thereof are shown in FIG. 8.

To evaluate the mechanical properties, polymer specimens according to Synthesis Examples 1 to 3 and Comparative Synthesis Examples 1 and 2 were prepared using the following method.

Specifically, each of the main body polymers of Synthesis Examples 1 to 3 and Comparative Synthesis Examples 1 and 2 was injected into a dumbbell-shaped mold (ASTM D638 type 4), followed by a photopolymerization reaction by transmitting light at a frequency of about 50/60 Hz for 5 minutes, thereby preparing polymer specimens.

Figure 8:
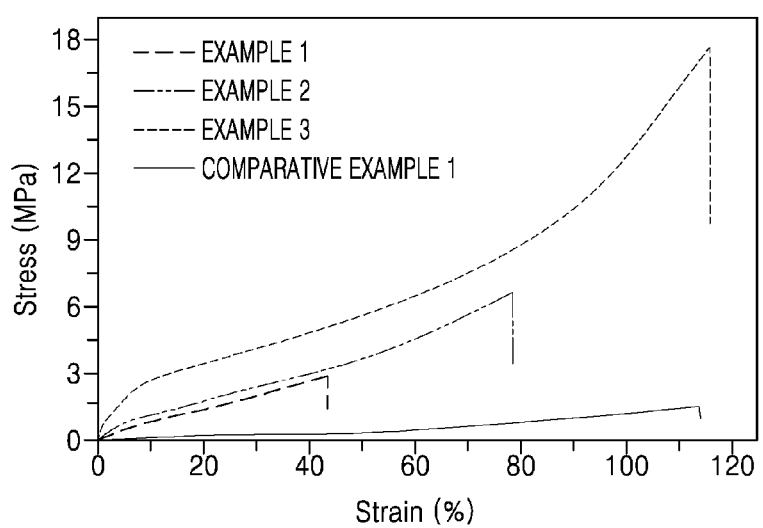
FIG. 8 is a graph showing the results of mechanical properties of main body polymers synthesized according to Synthesis Examples 1 to 3 and Comparative Synthesis Examples 1 and 2.

Referring to FIG. 8, the main body polymer according to Synthesis Example 3 exhibited a maximum strain of about 120%, whereas the main body polymer according to Comparative Synthesis Example 1 exhibited a maximum strain of about 46%. From these results, it can be confirmed that the maximum strain of the main body polymer according to Synthesis Example 3 was enhanced as compared to that of the main body polymer according to Comparative Synthesis Example 1.

In addition, the main body polymer according to Synthesis Example 3 exhibited a maximum stress of 18 MPa, whereas the main body polymer according to Comparative Synthesis Example 1 exhibited a maximum stress close to 0 MPa and the main body polymer according to Comparative Synthesis Example 2 exhibited a maximum stress of about 1.4 MPa. From these results, it can be confirmed that the maximum stress of the main body polymer according to Synthesis Example 3 was enhanced as compared to those of the main body polymers according to Comparative Synthesis Examples 1 and 3.

Evaluation Example 2: Voltage and Power Evaluation

The voltage and power of the flexible thermoelectric module cells for a touch sensor manufactured according to Examples 1 to 5 were evaluated. The results thereof are shown in FIGS. 10 and 11, respectively.

Figure 9:
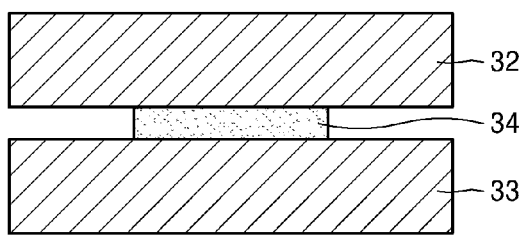
FIG. 9 is a view illustrating a method for measuring the voltage and power of flexible thermoelectric module cells for a touch sensor according to Examples 1 to 5.

To evaluate voltage and power, each of flexible thermoelectric module cells 34 for a touch sensor manufactured according to Examples 1 to 5 was arranged between two Peltier device substrates 32 and 33 in the same manner as illustrated in FIG. 9. In this regard, when power supply apparatuses are each used, a temperature change according to the power supplied is generated. A difference between a temperature at the top of the substrate 32 (on the cooling side) and a temperature at the bottom of the substrate 33 (on the heating side) was adjusted to be within a range of 0° C. and 20° C., and open-circuit voltage and maximum power, generated according to each temperature change, were measured.

Figure 10:
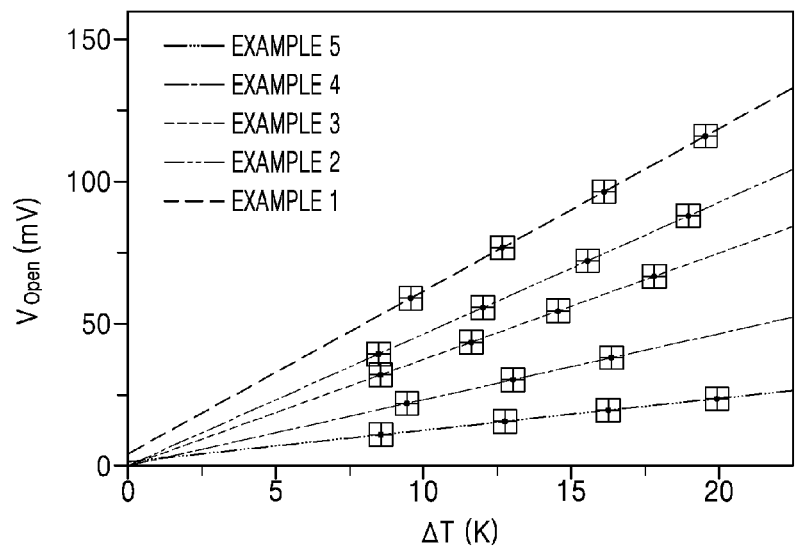
FIG. 10 is a graph showing an open-circuit voltage ($V_{open}$) according to a difference between a temperature at the top of a substrate (on the cooling side) and a temperature at the bottom of another substrate (on the heating side), of the flexible thermoelectric module cells for a touch sensor according to Examples 1 to 5.

Referring to FIG. 10, when the difference between a temperature at the top of the substrate 32 (on the cooling side) and a temperature at the bottom of the substrate 33 (on the heating side), manufactured according to Examples 1 to 5, is 20° C., the open-circuit voltages ($V_{open}$) of the flexible thermoelectric module cells for a touch sensor manufactured according to Examples 1 to 5 were about 25 mV, about 50 mV, about 75 mV, about 85 mV, and about 120 mV, respectively.

Figure 11:
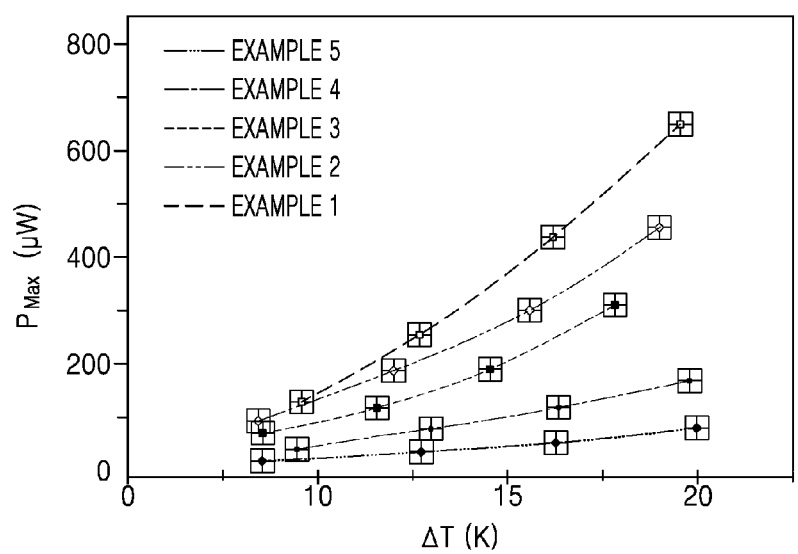
FIG. 11 is a graph showing a maximum power ($P_{max}$) according to a difference between a temperature at the top of a substrate (on the cooling side) and a temperature at the bottom of another substrate (on the heating side), of the flexible thermoelectric module cells for a touch sensor according to Examples 1 to 5.

Referring to FIG. 11, when the difference between a temperature at the top of the substrate 32 (on the cooling side) and a temperature at the bottom of the substrate 33 (on the heating side), manufactured according to Examples 1 to 5, is 20° C., the maximum powers ($P_{max}$) of the flexible thermoelectric module cells for a touch sensor manufactured according to Examples 1 to 5 were about 50 µW, about 150 µW, about 350 µW, about 500 µW, and about 700 µW, respectively.

From these results, it can be seen that the voltages and powers of the flexible thermoelectric module cells for a touch sensor manufactured according to Examples 1 to 5 were controllable through adjustment of the number of block p-type thermoelectric element pieces and block n-type thermoelectric element pieces. It can also be confirmed that, in the flexible thermoelectric module cells for a touch sensor manufactured according to Examples 1 to 5, the generated voltage and power were increased as the number of the block p-type thermoelectric elements and the block n-type thermoelectric elements increased.

As is apparent from the foregoing description, a flexible thermoelectric module cell for a touch sensor according to an embodiment not only has flexible mechanical properties such as combined ductility and rigidity, but also has voltage and power that are controllable by adjusting the number of block p-type thermoelectric element pieces and block n-type thermoelectric element pieces. Thus, the flexible thermoelectric module cell enables touch sensing only based on the thermoelectric effect, and thus is applicable to cells for touch sensors of various designs without a need for a person to go directly to an industrially dangerous place.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A flexible thermoelectric module cell for a touch sensor, comprising:
   a main body comprising a polymer comprising a main chain of a siloxane-based structural unit, and at least one vinyl group-containing photopolymerizable acrylate-based compound and an isocyanate-based compound that are linked to the main chain; and
   block p-type thermoelectric elements and block n-type thermoelectric elements that are alternately inserted into the main body,
   wherein the polymer comprises a polymer of Formula 1 below:

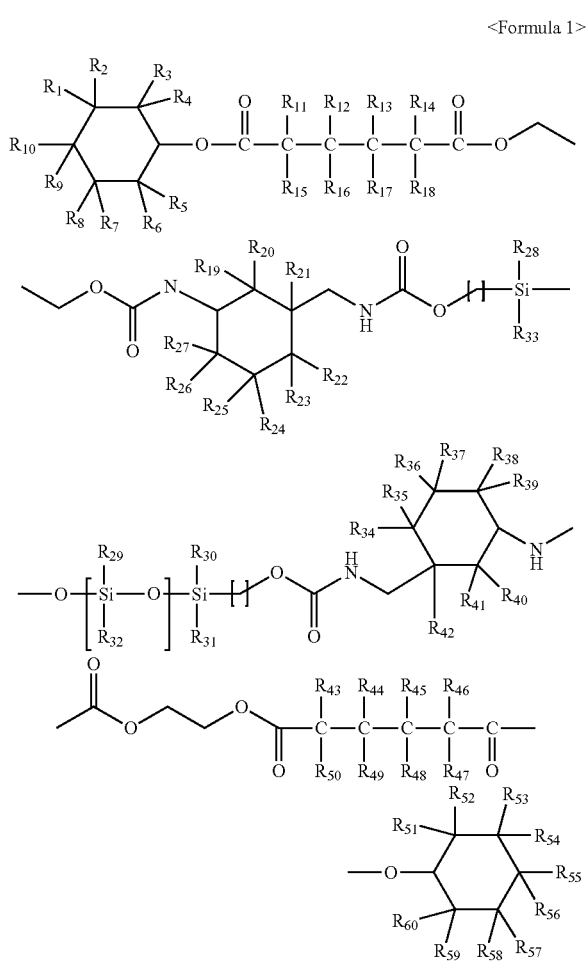

<Formula 1> wherein, in Formula 1, $R_1$ to $R_{60}$ are each independently a hydrogen atom, a deuterium atom, a substituted or unsubstituted $C_1$-$C_{10}$ alkyl group, or a combination thereof.

2. The flexible thermoelectric module cell of claim 1, wherein the siloxane-based structural unit is a structural unit derived from a siloxane-based monomer having a hydroxyl group at an end thereof.

3. The flexible thermoelectric module cell of claim 1, wherein the vinyl group-containing photopolymerizable acrylate-based compound comprises a compound selected from 2-hydroxyethyl methacrylate, 3,3,5-trimethyl cyclohexyl acrylate, and a combination thereof.

4. The flexible thermoelectric module cell of claim 1, wherein the isocyanate-based compound comprises isophorone diisocyanate.

5. The flexible thermoelectric module cell of claim 1, wherein the polymer has a weight average molecular weight of 1,000 or more.

6. The flexible thermoelectric module cell of claim 1, wherein the block p-type thermoelectric elements or the block n-type thermoelectric elements each independently comprise nanoparticles, nanowires, nanobelts, nanoribbons, or a combination thereof, and the block p-type thermoelectric elements or the block n-type thermoelectric elements are one or more element selected from a transition metal, a rare earth element, a Group 13 element, a Group 14 element, a Group 15 element, and a Group 16 element.

7. The flexible thermoelectric module cell of claim 1, wherein the block p-type thermoelectric elements and the block n-type thermoelectric elements are connected in series via metal electrodes.

8. The flexible thermoelectric module cell of claim 1, wherein the block p-type thermoelectric elements or the block n-type thermoelectric elements are each independently replaceable.

9. The flexible thermoelectric module cell of claim 1, wherein power is controllable by adjusting the number of the block p-type thermoelectric elements and the block n-type thermoelectric elements.

10. The flexible thermoelectric module cell of claim 1, wherein the flexible thermoelectric module cell is operable by a voltage change generated according to a difference in external temperature through the Seebeck effect.

11. The flexible thermoelectric module cell of claim 1, wherein the flexible thermoelectric module cell has a maximum stress of 18 MPa.

12. The flexible thermoelectric module cell of claim 1, wherein the flexible thermoelectric module cell has a maximum strain of 120%.

13. A touch sensor comprising the flexible thermoelectric module cell of claim 1.

14. The touch sensor of claim 13, wherein the touch sensor comprises a plurality of buttons,
wherein each of the plurality of buttons comprises the flexible thermoelectric module cell.

15. A method of manufacturing the flexible thermoelectric module cell for a touch sensor of claim 1, the method comprising:
photopolymerizing a composition for forming a main body polymer, the composition comprising a monomer having a siloxane-based structural unit with a hydroxyl group at an end thereof, at least one vinyl group-containing photopolymerizable acrylate-based compound, and an isocyanate-based compound, to thereby synthesize a main body;
packing a mold with p-type thermoelectric element powder or n-type thermoelectric element powder and sintering and cutting the packed mold to prepare block p-type thermoelectric elements and block n-type thermoelectric elements; and
alternately inserting the block p-type thermoelectric elements and the block n-type thermoelectric elements into the main body and arranging a metal paste and metal wires to manufacture the flexible thermoelectric module cell for a touch sensor.

16. The method of claim 15, wherein the vinyl group-containing photopolymerizable acrylate-based compound comprises 3,3,5-trimethyl cyclohexyl acrylate in an amount of about 0.01 wt % to about 50 wt % with respect to a total of 100 wt % of the composition for forming a main body polymer.

17. The method of claim 15, further comprising connecting the block p-type thermoelectric elements and the block n-type thermoelectric elements in series via metal wires.

* * * * *